US012618151B2

(12) United States Patent
Sakashita et al.

(10) Patent No.: US 12,618,151 B2
(45) Date of Patent: May 5, 2026

(54) SUBSTRATE PROCESSING APPARATUS

(71) Applicant: Tokyo Electron Limited, Tokyo (JP)

(72) Inventors: Kuniyasu Sakashita, Oshu (JP);
Tosihiko Jo, Nirasaki (JP)

(73) Assignee: TOKYO ELECTRON LIMITED,
Tokyo (JP)

( * ) Notice: Subject to any disclaimer, the term of this
patent is extended or adjusted under 35
U.S.C. 154(b) by 405 days.

(21) Appl. No.: 18/135,917

(22) Filed: Apr. 18, 2023

(65) Prior Publication Data

US 2023/0340666 A1    Oct. 26, 2023

(30) Foreign Application Priority Data

Apr. 25, 2022    (JP) ................................ 2022-071477

(51) Int. Cl.
*C23C 16/455* (2006.01)
*C23C 16/458* (2006.01)
*C23C 16/46* (2006.01)

(52) U.S. Cl.
CPC .. *C23C 16/45502* (2013.01); *C23C 16/45563*
(2013.01); *C23C 16/4584* (2013.01); *C23C*
*16/46* (2013.01)

(58) Field of Classification Search
CPC ........ C23C 16/45502; C23C 16/45563; C23C
16/4584; C23C 16/46
See application file for complete search history.

(56) References Cited

U.S. PATENT DOCUMENTS 8,398,773 B2 *    3/2013   Jdira ................. H01L 21/67109
                                                      118/724
2018/0076021 A1 *    3/2018   Fukushima ....... H01L 21/67109

FOREIGN PATENT DOCUMENTS

EP          3608440 A1 *   2/2020   .......... C23C 16/455
JP          H04157716 A    5/1992
JP          2016-178136 A   10/2016
JP          2020027941 A    2/2020

* cited by examiner

*Primary Examiner* — Parviz Hassanzadeh
(74) *Attorney, Agent, or Firm* — Nath, Goldberg &
Meyer; Jerald L. Meyer

(57) ABSTRACT

A substrate processing apparatus includes: an inner cylinder
having a first region formed inside the inner cylinder to
accommodate a substrate; an outer cylinder provided outside
the inner cylinder with a second region interposed between
the inner cylinder and the outer cylinder and including an
exhaust port formed in an end portion of a sidewall of the
outer cylinder; a nozzle configured to discharge a gas to the
first region; and a gas flow regulator including a plurality of
slits provided from an upstream side toward a downstream
side in a flow direction of the gas in a flow path of the gas
from the first region to the exhaust port.

5 Claims, 9 Drawing Sheets

FIG. 7

| Slit A1 | Slit A2 | Slit A3 |
|---------|---------|---------|
| 1 | 1 | 1 |
| 2 | 2 | 2 |
| 3 | 3 | 3 |
| 4 | 4 | 4 |
| 5 | 5 | 5 |
| 6 | 6 | 6 |
| 7 | 7 | 7 |
| 8 | 8 | 8 |
| 9 | 9 | 9 |
| 10 | 10 | 10 |

FIG. 9

| Slit A1 | Slit A2 | Slit A3 |
|---------|---------|---------|
| 1 | 1 | 1 |
| 2 | 2 | 2 |
| 3 | 3 | 3 |
| 4 | 4 | 4 |
| 5 | 5 | 5 |
| 6 | 6 | 6 |
| 7 | 7 | 7 |
| 8 | 8 | 8 |
| 9 | 9 | 9 |
| 10 | 10 | 10 |

SUBSTRATE PROCESSING APPARATUS

CROSS-REFERENCE TO RELATED APPLICATION

This application is based upon and claims the benefit of priority from Japanese Patent Application No. 2022-071477, filed on Apr. 25, 2022, the entire contents of which are incorporated herein by reference.

TECHNICAL FIELD

The present disclosure relates to a substrate processing apparatus.

BACKGROUND

In a substrate processing apparatus provided with a processing container including an inner cylinder and an outer cylinder which are arranged concentrically, a configuration in which a plate-shaped rectifying plate is provided between the inner cylinder and the outer cylinder has been known (see Patent Document 1, for example).

PRIOR ART DOCUMENT

Patent Document

Patent Document 1: Japanese Laid-Open Patent Publication No. 2016-178136

SUMMARY

According to one embodiment of the present disclosure, there is provided a substrate processing apparatus including: an inner cylinder having a first region formed inside the inner cylinder to accommodate a substrate; an outer cylinder provided outside the inner cylinder with a second region interposed between the inner cylinder and the outer cylinder and including an exhaust port formed in an end portion of a sidewall of the outer cylinder; a nozzle configured to discharge a gas to the first region; and a gas flow regulator including a plurality of slits provided from an upstream side toward a downstream side in a flow direction of the gas in a flow path of the gas from the first region to the exhaust port.

BRIEF DESCRIPTION OF DRAWINGS

The accompanying drawings, which are incorporated in and constitute a portion of the specification, illustrate embodiments of the present disclosure, and together with the general description given above and the detailed description of the embodiments given below, serve to explain the principles of the present disclosure.

FIG. 7 is a diagram illustrating an opening position of a slit.

FIG. 9 is a diagram illustrating an opening position of a slit.

DETAILED DESCRIPTION

Figure 1:
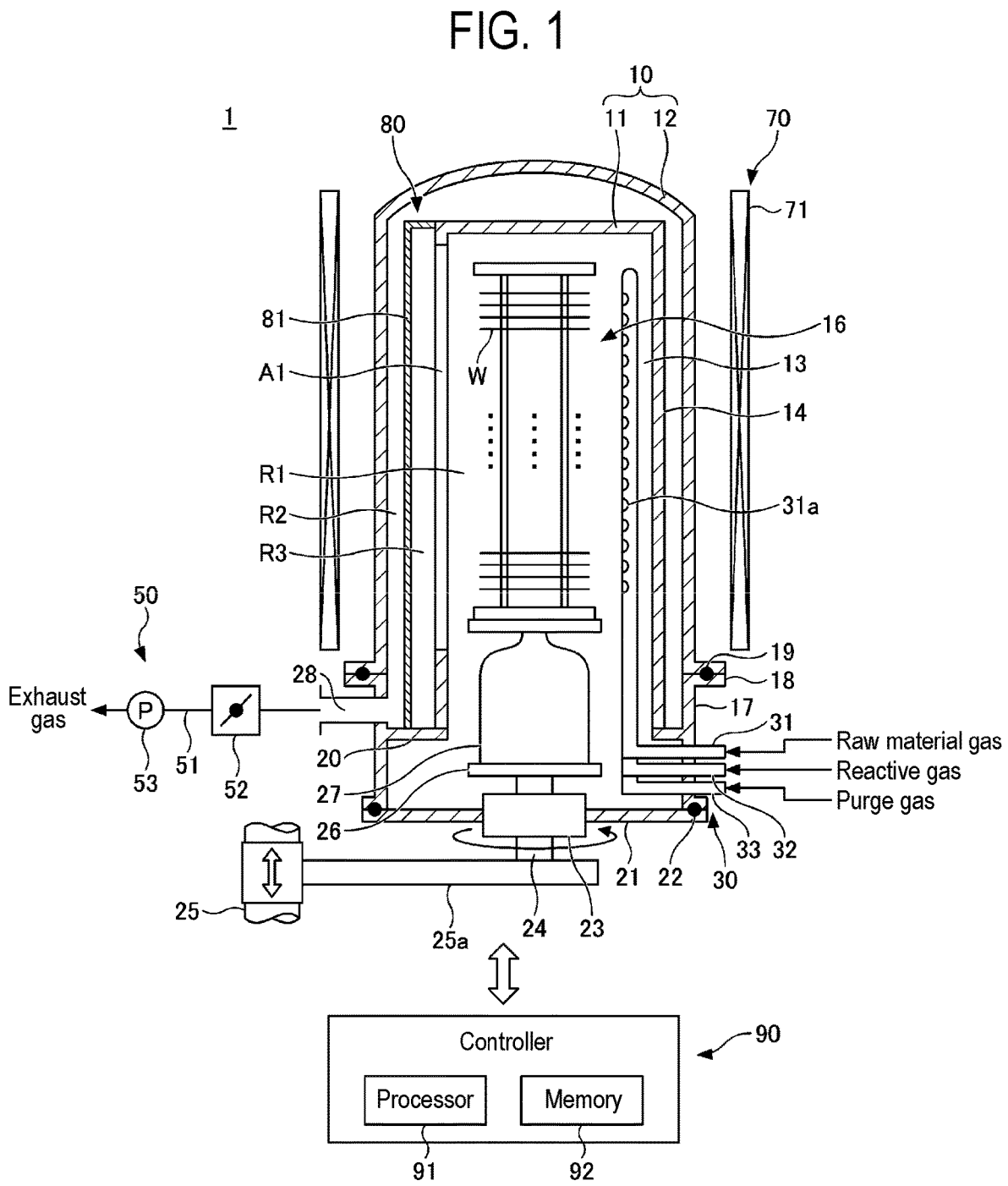
FIG. 1 is a schematic diagram illustrating a substrate processing apparatus according to an embodiment.

Hereinafter, non-limiting exemplary embodiments of the present disclosure will be described with reference to the accompanying drawings. In all the accompanying drawings, the same or corresponding members or components will be denoted by the same or corresponding reference numerals, and redundant descriptions thereof will be omitted. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

[Substrate Processing Apparatus]

Figure 2:
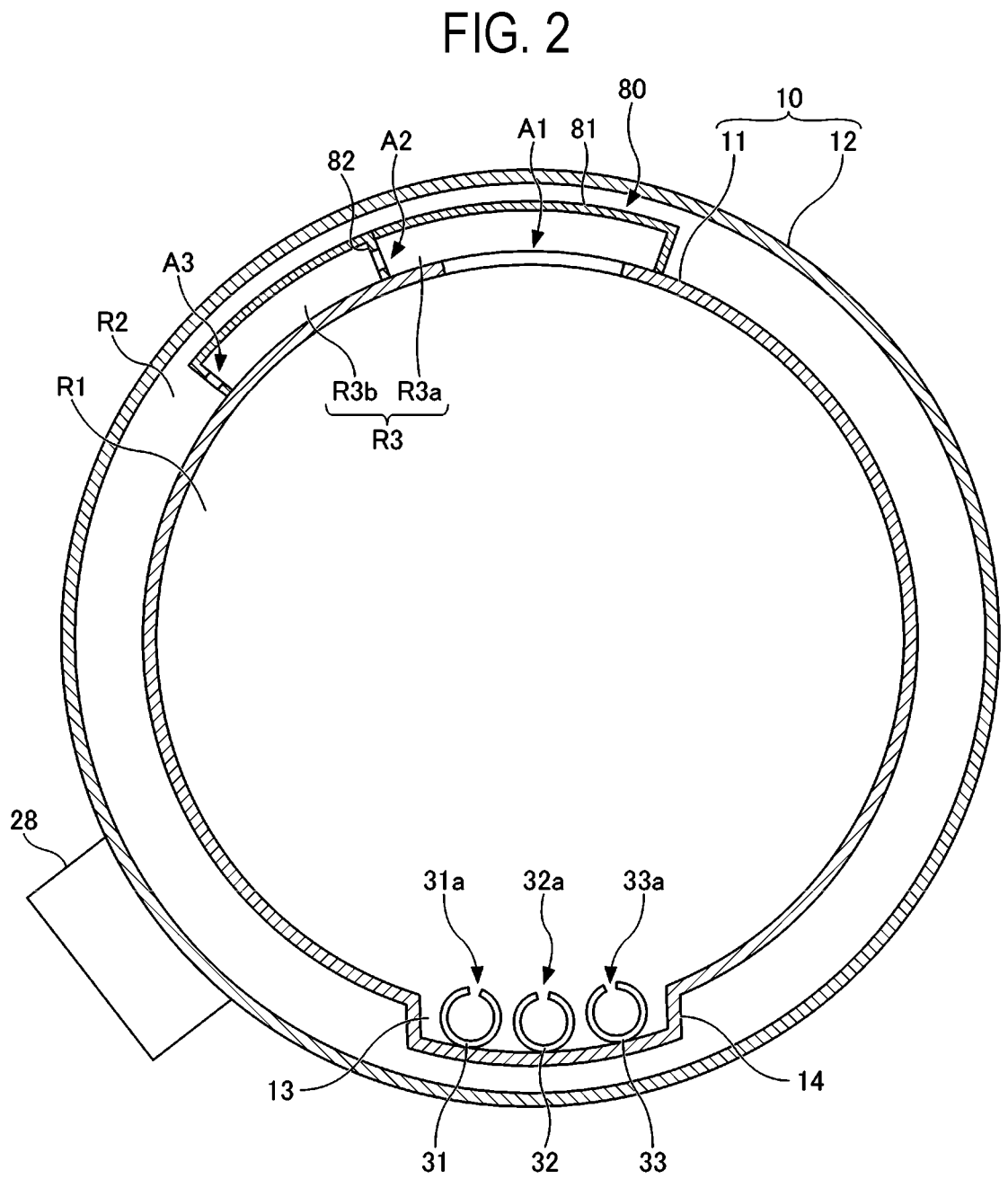
FIG. 2 is a schematic diagram illustrating a gas flow regulator.

A substrate processing apparatus 1 according to an embodiment will be described with reference to FIGS. 1 and 2. As illustrated in FIG. 1, the substrate processing apparatus 1 is a batch type vertical heat treatment apparatus that heats a plurality of substrates W at once. The substrate W is, for example, a semiconductor wafer.

The substrate processing apparatus 1 includes a processing container 10, a gas supplier 30, an exhauster 50, a heating part 70, a gas flow regulator 80, and a controller 90.

The interior of the processing container 10 may be reduced in pressure. The processing container 10 has a double tube structure in which an inner tube 11 and an outer tube 12 are coaxially arranged.

The inner tube 11 has a cylindrical shape with an open lower end and a ceiling. The inner tube 11 forms therein a first region R1 in which the substrate W is accommodated. The ceiling of the inner tube 11 is flat, for example. The inner tube 11 is formed of, for example, a heat-resistant material such as quartz.

The outer tube 12 has a cylindrical shape with an open lower end and a ceiling. The outer tube 12 is provided so as to cover a sidewall and the ceiling of the inner tube 11. The outer tube 12 is provided outside the inner tube 11 with a second region R2 interposed therebetween. The outer tube 12 is formed of a heat-resistant material such as quartz.

An accommodation portion 13 for accommodating a nozzle is formed in one side of the inner tube 11 along an axial direction (vertical direction) thereof. For example, a portion of the sidewall of the inner tube 11 protrudes outward to form a convex portion 14, and an interior of the convex portion 14 is formed as the accommodation portion 13.

A slit A1 is formed in the sidewall of the inner pipe 11 at the opposite side so as to correspond to the accommodation portion 13. The slit A1 is an exhaust port through which a gas in the first region R1 is exhausted. The slit A1 has a rectangular shape with a vertical direction thereof as a longitudinal direction. A slit length of the slit A1 may be the same as a length of a boat 16, or may be longer than the length of the boat 16.

A lower end of the processing container 10 is supported by a cylindrical manifold 17. The manifold 17 is formed of, for example, stainless steel. A flange 18 is formed at an upper end of the manifold 17. A lower end of the outer tube 12 is attached to and supported by the flange 18. A sealing member 19 such as an O-ring is provided between the flange 18 and the lower end of the outer pipe 12.

An annular support 20 is provided on an upper inner wall of the manifold 17. A lower end of the inner tube 11 is attached to and supported by the support 20. A cover 21 is air-tightly fitted into an opening in a lower end of the manifold 17 via a sealing member 22 such as an O-ring. The cover 21 and the sealing member 22 air-tightly close an opening in the lower end of the processing container 10, that is, the opening of the manifold 17. The cover 21 is formed of, for example, stainless steel.

A rotary shaft 24, which rotatably supports the boat 16 via a magnetic fluid seal 23, is provided through a central portion of the cover 21. A bottom portion of the rotary shaft 24 is rotatably supported by an arm 25a of an elevating mechanism 25, which is configured as a boat elevator.

A rotary plate 26 is provided on an upper end of the rotary shaft 24. The boat 16 is placed on the rotary plate 26 via a heat-insulation container 27 formed of quartz. Thus, by moving the elevating mechanism 25 up and down, the cover 21 and the boat 16 integrally move up and down to insert and separate the boat 16 into and from the processing container 10. The boat 16 may be accommodated in the processing container 10. The boat 16 holds a plurality of (for example, 50 to 150) substrates W on shelves along the vertical direction.

The gas supplier 30 includes a plurality of (for example, three) nozzles 31 to 33. The plurality of nozzles 31 to 33 are provided in a line along the circumferential direction inside the accommodation portion 13 of the inner tube 11. Each of the nozzles 31 to 33 is provided inside the inner pipe 11 along the vertical direction, and includes a base end bent in an L shape so as to pass through the manifold 17. Each of the nozzles 31 to 33 is formed of, for example, quartz.

A plurality of gas holes 31a are provided in the nozzle 31 at predetermined intervals along the vertical direction. The plurality of gas holes 31a are oriented, for example, toward the center (the side of the substrate W) of the inner tube 11. The nozzle 31 horizontally discharges a raw material gas, which is introduced from a raw material gas source (not illustrated), toward the substrate W from the plurality of gas holes 31a. The raw material gas is, for example, a gas containing silicon or a metal.

A plurality of gas holes 32a are provided in the nozzle 32 at predetermined intervals along the vertical direction. The plurality of gas holes 32a are oriented, for example, toward the center (the side of the substrate W) of the inner tube 11. The nozzle 32 horizontally discharges a reactive gas, which is introduced from a reactive gas source (not illustrated), toward the substrate W from the plurality of gas holes 32a. The reactive gas is a gas for reacting with the raw material gas to produce a reaction product. The reactive gas is, for example, an oxidizing gas or a nitriding gas.

A plurality of gas holes 33a are provided in the nozzle 33 at predetermined intervals along the vertical direction. The plurality of gas holes 33a are oriented, for example, toward the center (the side of the substrate W) of the inner tube 11. The nozzle 33 horizontally discharges a purge gas, which is introduced from a purge gas source (not illustrated), toward the substrate W from the plurality of gas holes 33a. The purge gas is a gas for purging the raw material gas or the reactive gas remaining inside the processing container 10. The purge gas is, for example, an inert gas such as a nitrogen gas or an argon gas.

The gas supplier 30 may mix a plurality of types of gases and discharge the same from one nozzle. Respective nozzles may have different shapes in different arrangements. The gas supplier 30 may be configured to supply other gases in addition to the raw material gas, the reactive gas, and the purge gas. The other gases may include a cleaning gas and an etching gas.

The exhauster 50 exhausts the gas, which is discharged from the interior of the inner tube 11 through the slit A1 and is discharged from the exhaust port 28 through the second region R2 between the inner tube 11 and the outer tube 12. The exhaust port 28 is formed in an upper sidewall of the manifold 17 and above the support 20. An exhaust pipe 51 is connected to the exhaust port 28. The exhaust pipe 51 is provided with a pressure regulating valve 52 and a vacuum pump 53 in order from the upstream side toward the downstream side in a gas flow direction. The exhauster 50 regulates the internal pressure of the processing container 10 by the pressure regulating valve 52 while sucking the gas in the processing container 10 by the vacuum pump 53 under the control of the controller 90.

The heating part 70 includes a cylindrical heater 71. The heater 71 is provided radially outside the outer tube 12 so as to surround the outer tube 12. The heater 71 heats the entire periphery of the processing container 10, thereby heating each substrate W accommodated in the processing container 10. The heating part 70 may further include a heat insulator.

The gas flow regulator 80 is provided in a gas flow path from the first region R1 to the exhaust port 28. The gas flow regulator 80 includes a cover member 81 and a partition plate 82.

The cover member 81 is provided in the second region R2. The cover member 81 is provided to protrude from the sidewall of the inner tube 11 toward the outer tube 12 so as to cover the slit A1 and forms a third region R3 between the sidewall of the inner tube 11 and the cover member 81. The cover member 81 is provided along the sidewall of the inner tube 11 and includes a circular arc portion in which a central angle in a horizontal cross section forms a circular arc of a predetermined angle. The predetermined angle is, for example, 45 degrees or more and 90 degrees or less. A vertical length of the cover member 81 is greater than the slit length of the slit A1 and is equal to or less than the vertical length of the inner tube 11. The cover member 81 is formed of, for example, a heat-resistant material such as quartz. The cover member 81 may be formed integrally with the inner tube 11, or may be formed separately from the inner tube 11.

The partition plate 82 is provided in the third region R3. The partition plate 82 extends along the radial direction of the inner tube 11 and divides the third region R3 into two regions R3a and R3b. The region R3a is a region facing the slit A1. The region R3b is located downstream of the region R3a in the gas flow direction, and is a region facing a slit A3 to be described later. The partition plate 82 is formed of, for example, a heat-resistant material such as quartz. The partition plate 82 may be formed integrally with the cover member 81, or may be formed separately from the cover member 81. The partition plate 82 is provided with a slit A2 for communicating the region R3a with the region R3b. The slit A2 is provided downstream of the slit A1 in the gas flow direction.

The slit A3 is provided in a sidewall of an end of the cover member 81 closer to the exhaust port 28. The slit A3 is provided downstream of the slit A2 in the gas flow direction.

The slit A3 is oriented toward the exhaust port 28. However, the slit A3 may be oriented toward a sidewall of the outer tube 12.

Each of the slits A1 to A3 has a rectangular shape, an elongated hole shape, or an elliptical shape with the vertical direction as the longitudinal direction and the horizontal direction as the transverse direction. The slits A1 to A3 have the same slit length. However, the slits A1 to A3 may have different slit lengths. The slit A1 may have the widest slit width among three slits A1 to A3. In this case, the concentration of the flow velocity near the slit A1 is alleviated. At least one of the slits A1 to A3 may be divided into a plurality of slits in the vertical direction.

The gas flow regulator 80 regulates the flow of the gas and guides the gas to the exhaust port 28 by passing the gas in the first region R1 through the slit A1, the slit A2, and the slit A3 in this order.

A computer having one or more processors 91, a memory 92, an input/output interface (not illustrated) and an electronic circuit (not illustrated) may be applied to the controller 90. The processor 91 is one of a CPU, an ASIC, an FPGA, a circuit composed of a plurality of discrete semiconductors, and the like, or a combination thereof. The memory 92 includes a volatile memory or a non-volatile memory (for example, a compact disk, a DVD, a hard disk, and a flash memory), and stores programs for operating the substrate processing apparatus 1 and recipes such as process conditions of a substrate processing. The processor 91 executes programs and recipes stored in the memory 92, thereby controlling each component of the substrate processing apparatus 1 to perform various processing.

As described above, the substrate processing apparatus 1 according to the embodiment includes the gas flow regulator 80 having the plurality of slits A1 to A3 provided in the gas flow path from the first region R1 to the exhaust port 28 from the upstream side toward the downstream side in the gas flow direction. In this way, by multiplexing the slits along the gas flow direction, it is possible to prevent uneven gas flow in the vertical direction of the first region R1. As a result, the uniformity of film formation characteristics between the substrates W (hereinafter referred to as "inter-plane uniformity") is improved.

Further, according to the substrate processing apparatus 1 of the embodiment, by widening the slit width of the slit A1 located closest to the first region R1 as well as multiplexing the slits along the gas flow direction, the concentration of the flow velocity near the slit A1 may be alleviated. As a result, the uniformity of film formation characteristics in the plane of the substrate W (hereinafter referred to as "in-plane uniformity") is improved.

Further, according to the substrate processing apparatus 1 of the embodiment, exhaust gas distribution in the vertical direction may be controlled by multiplexing the slits along the gas flow direction and varying the slit lengths of the slits A1 to A3.

On the other hand, in a substrate processing apparatus that does not have the gas flow regulator 80, the discharge of the gas from the bottom of a height region (hereinafter referred to as "process region") in which the substrate W is accommodated increases, and the discharge of the gas from the top of the process region decreases. For this reason, the gas may stay in the top of the process region inside the inner tube 11, causing excessive decomposition of the raw material gas or deactivation of the reactive gas, which may deteriorate the inter-plane uniformity of film formation characteristics. Further, when the slit A1 has a narrow slit width, the excessively decomposed gas may be concentrated near the slit A1, so that a film tends to be deposited on a periphery edge of the substrate W, which may deteriorate the in-plane uniformity.

Figure 3:
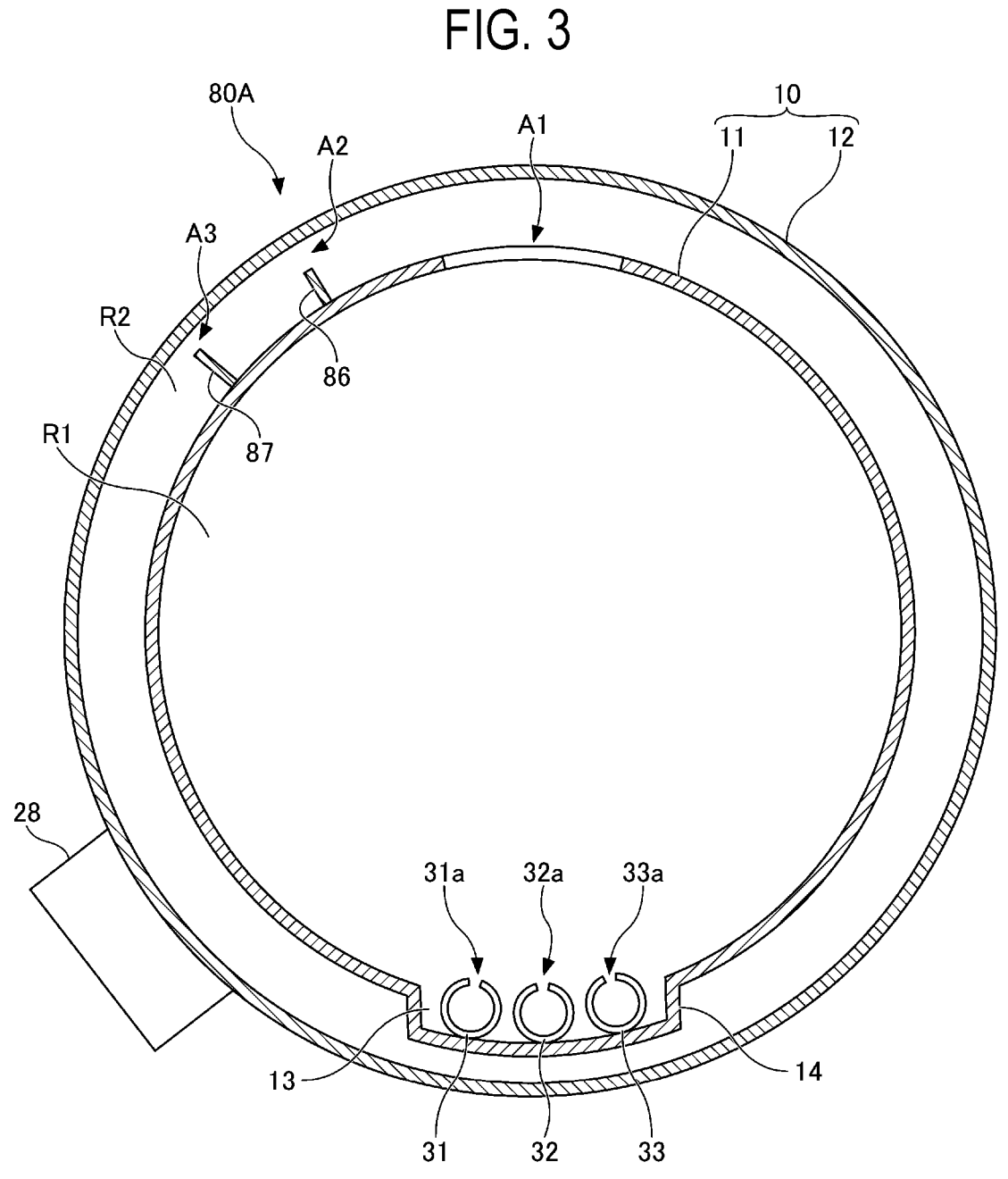
FIG. 3 is a schematic diagram illustrating a gas flow regulator according to a first modification.

Next, a gas flow regulator 80A according to a first modification will be described with reference to FIG. 3. The gas flow regulator 80A is provided in the gas flow path from the first region R1 to the exhaust port 28. The gas flow regulator 80A includes a first plate-shaped member 86 and a second plate-shaped member 87.

The first plate-shaped member 86 extends along the radial direction of the inner tube 11 from the sidewall of the inner tube 11 toward the sidewall of the outer tube 12, and narrows a gap between the sidewall of the inner tube 11 and the sidewall of the outer tube to form the slit A2. A vertical length of the first plate-shaped member 86 is, for example, greater than or equal to the vertical length of the process region and is less than or equal to the vertical length of the inner tube 11.

The second plate-shaped member 87 is provided downstream of the first plate-shaped member 86 in the gas flow direction. The second plate-shaped member 87 extends along the radial direction of the inner tube 11 from the sidewall of the inner tube 11 toward the sidewall of the outer tube 12, and narrows the gap between the sidewall of the inner tube 11 and the sidewall of the outer tube to form the slit A3. A vertical length of the second plate-shaped member 87 is, for example, greater than or equal to the vertical length of the process region and is less than or equal to the vertical length of the inner tube 11.

Similarly to the gas flow regulator 80, the gas flow regulator 80A adjusts the flow of the gas and guides the gas to the exhaust port 28 by passing the gas in the first region R1 through the slit A1, the slit A2, and the slit A3 in this order. The substrate processing apparatus including the gas flow regulator 80A also has the same effect as the substrate processing apparatus 1 described above.

Figure 4:
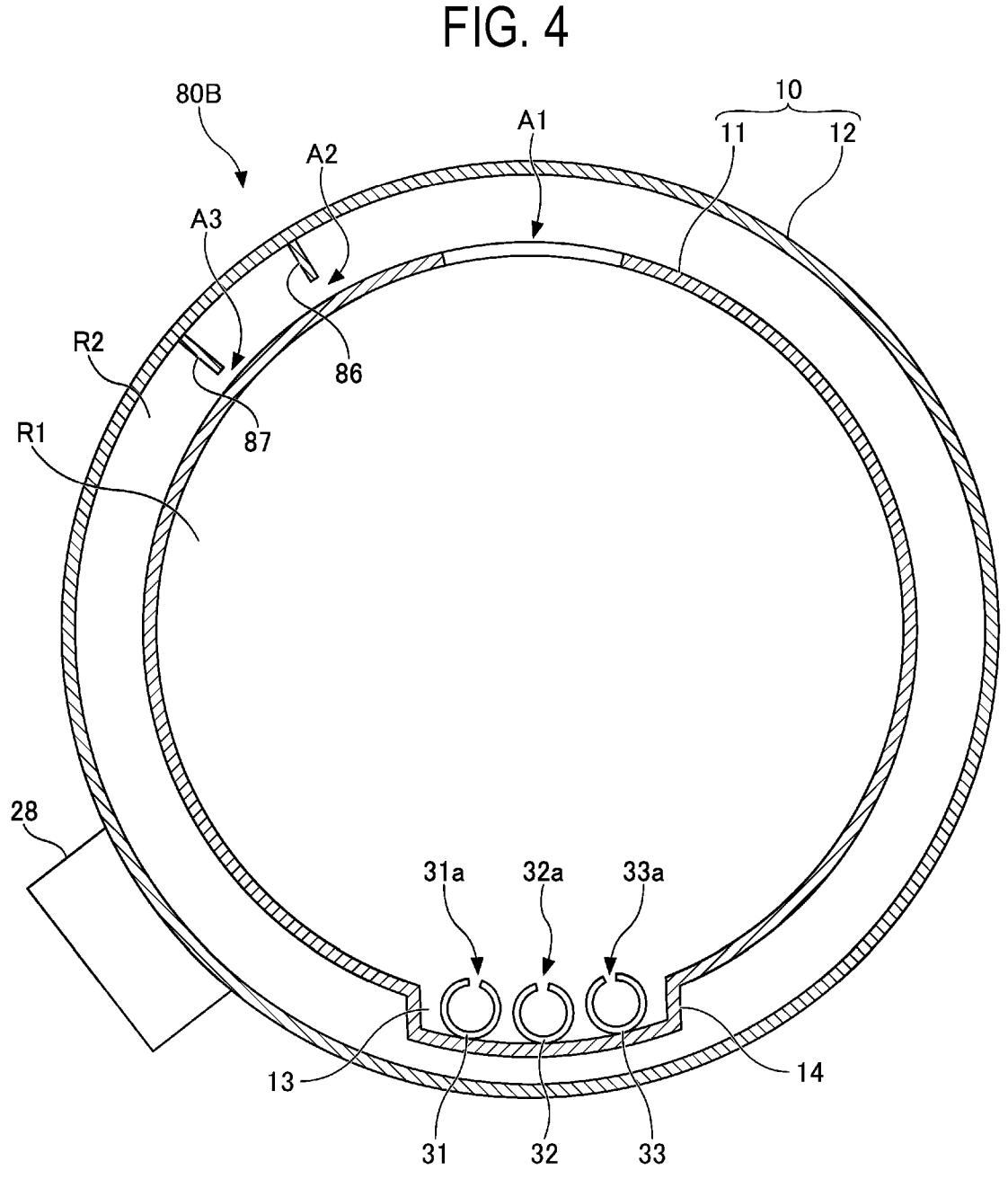
FIG. 4 is a schematic diagram illustrating a gas flow regulator according to a second modification.

Next, a gas flow regulator 80B according to a second modification will be described with reference to FIG. 4. The gas flow regulator 80B differs from the gas flow regulator 80A in that the first plate-shaped member 86 and the second plate-shaped member 87 extend along the radial direction of the inner tube 11 from the sidewall of the outer pipe 12 toward the sidewall of the inner pipe 11.

The first plate-shaped member 86 extends along the radial direction of the inner tube 11 from the sidewall of the outer tube 12 toward the sidewall of the inner tube 11, and narrows the gap between the sidewall of the inner tube 11 and the sidewall of the outer tube to form the slit A2. The vertical length of the first plate-shaped member 86 is, for example, greater than or equal to the vertical length of the process region, and is less than or equal to the vertical length of the inner tube 11.

The second plate-shaped member 87 is provided downstream of the first plate-shaped member 86 in the gas flow direction. The second plate-shaped member 87 extends along the radial direction of the inner tube 11 from the sidewall of the outer tube 12 toward the sidewall of the inner tube 11, and narrows the gap between the sidewall of the inner tube 11 and the sidewall of the outer tube 12 to form the slit A3. The vertical length of the second plate-shaped member 87 is, for example, greater than or equal to the vertical length of the process region, and is less than or equal to the vertical length of the inner tube 11.

Similarly to the gas flow regulator 80A, the gas flow regulator 80B adjusts the flow of the gas and guides the gas to the exhaust port 28 by passing the gas in the first region R1 through the slit A1, the slit A2, and the slit A3 in this order. The substrate processing apparatus including the gas flow regulator 80B also has the same effect as the substrate processing apparatus 1 described above.

[Analysis Result]

Analysis results which have confirmed that uneven gas flow in the vertical direction of the first region R1 is suppressed by using the substrate processing apparatus 1 according to the embodiment will be described.

(Analysis A)

Analysis A was conducted by simulation to calculate, in the substrate processing apparatus 1, a gas flow-rate distribution in the vertical direction at the positions of the slits A1 to A3 when the gas was discharged from the nozzle 31 to the first region R1 and the gas was discharged through the exhaust port 28. In Analysis A, the slit width of the slit A1 was set to 40 mm, the slit width of the slit A2 was set to 10 mm, and the slit width of the slit A3 was set to 5 mm. In addition, the slit lengths of the slits A1 to A3 were set so as to vertically extend longer than the length of the process region. Further, the slit lengths of the slits A1 to A3 were set to be the same.

Figure 5:
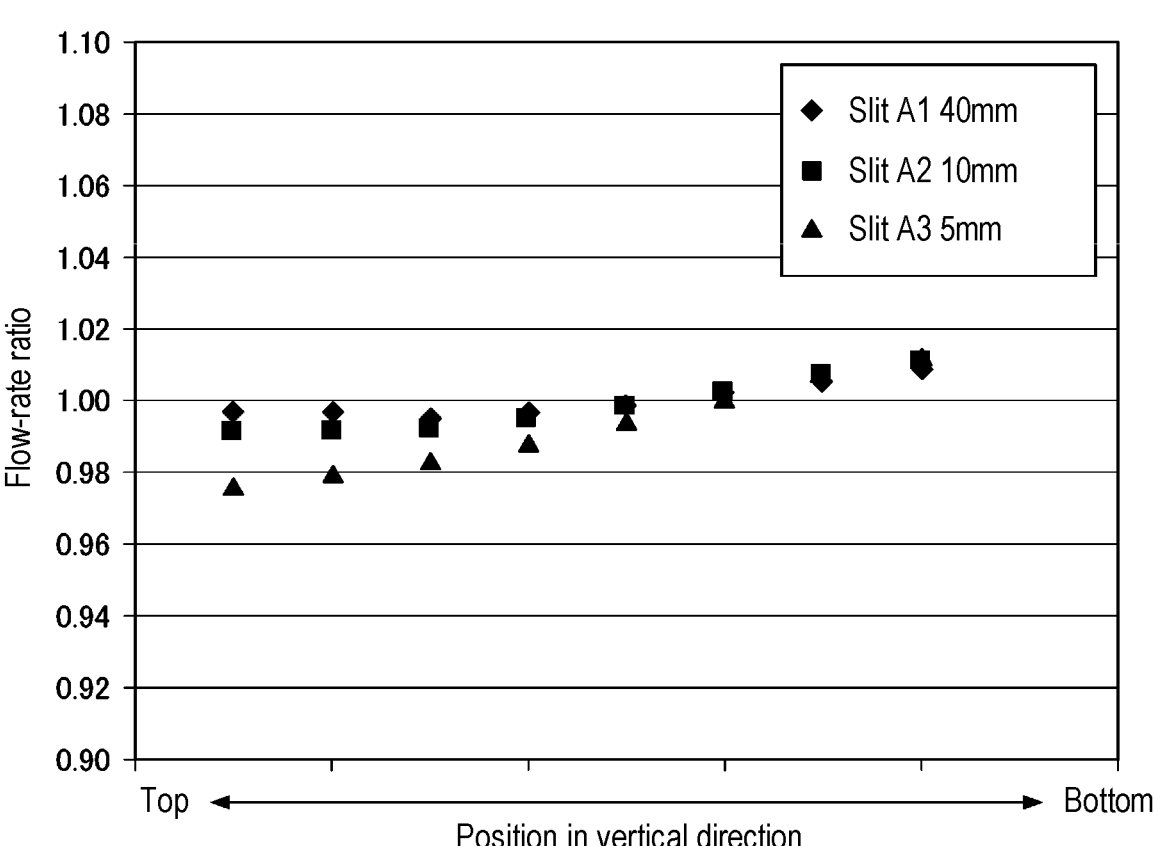
FIG. 5 is a diagram illustrating analysis results of a gas flow-rate distribution in a vertical direction.

FIG. 5 is a diagram illustrating analysis results of the gas flow-rate distribution in the vertical direction. In FIG. 5, the horizontal axis indicates each vertical region when the process region is vertically divided into eight equal regions, and the vertical axis indicates a gas flow-rate ratio in each region. In addition, the gas flow-rate ratio was calculated by the following equation (1).

Gas flow-rate ratio=flow rate in each region/average value of flow rates in eights regions of the slit A1    (1)

In FIG. 5, rhombic marks, square marks, and triangular marks indicate the gas flow-rate ratios at the positions of the slits A1, A2 and A3, respectively.

As illustrated in FIG. 5, it can be seen that the flow rate is larger at the bottom than at the top at the position of the slit A3, whereas at the position of the slit A1, there is almost no difference in the flow rate between the top and the bottom. It was found from this result that uneven gas flow in the vertical direction of the first region R1 may be suppressed by providing the slit A1 with a slit width of 40 mm, the slit A2 with a slit width of 10 mm, and the slit A3 with a slit width of 5 mm from the upstream side toward the downstream side in the gas flow direction.

(Analysis B)

Analysis B was conducted by simulation to calculate, in the substrate processing apparatus 1, a gas flow-rate distribution in the vertical direction at the position of the slit A1 when the gas was discharged from the nozzle 31 to the first region R1 and the gas was discharged through the exhaust port 28. In Analysis B, the simulation was performed by changing the slit widths of the slits A1 to A3. In addition, the slit lengths of the slits A1 to A3 were set so as to vertically extend longer than the length of the process region. Further, the slit lengths of the slits A1 to A3 were set to be the same. In Analysis B, for comparison, a similar simulation was performed for a substrate processing apparatus having one slit A1 without the slits A2 and A3.

Figure 6:
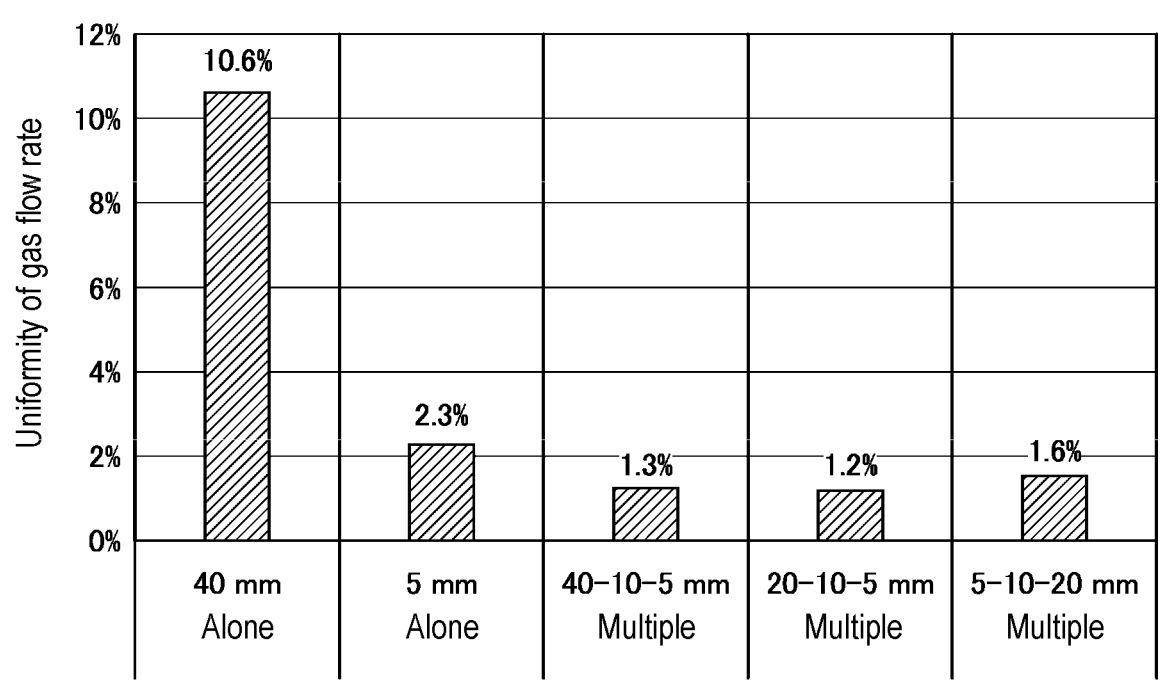
FIG. 6 is a diagram illustrating analysis results of a uniformity of a gas flow rate.

FIG. 6 is a diagram illustrating analysis results of the uniformity of a gas flow rate, and illustrates the uniformity of the gas flow rate in the vertical direction in each substrate processing apparatus. In addition, the uniformity was calculated by the following equation (2).

Uniformity=(maximum value−minimum value)/average value    (2)

However, in Equation (2), the maximum value, the minimum value, and the average value are the maximum flow, the minimum value, and the average value of the flow rates in the eight regions of the slit A1, respectively.

In FIG. 6, a first bar graph from the left side indicates the result when there is the slit A1 alone (slit width: 40 mm). A second bar graph from the left side indicates the result when there is the slit A1 alone (slit width: 5 mm). A third bar graph from the left side indicates the result when there are the slit A1 (slit width: 40 mm), the slit A2 (slit width: 10 mm) and the slit A3 (slit width: 5 mm). A fourth bar graph from the left side indicates the result when there are the slit A1 (slit width: 20 mm), the slit A2 (slit width: 10 mm) and the slit A3 (slit width: 5 mm). A fifth bar graph from the left side illustrates the result when there are the slit A1 (slit width: 5 mm), the slit A2 (slit width: 10 mm) and the slit A3 (slit width: 20 mm).

As illustrated in FIG. 6, it can be seen that the uniformity of the gas flow rate in the vertical direction at the position of the slit A1 is in a range from 1.2% to 1.6% when the substrate processing apparatus includes the three slits A1 to A3. On the other hand, it can be seen that the uniformity of the gas flow rate in the vertical direction at the position of the slit A1 is in a range from 2.3% to 10.6% when the substrate processing apparatus includes the slit A1 alone. It was found from this result that uneven gas flow in the vertical direction of the first region R1 may be suppressed by providing multiple slits from the upstream side to the downstream side in the gas flow direction.

Further, as illustrated in FIG. 6, it can be seen that, when the substrate processing apparatus includes the three slits A1 to A3, the uniformity of the gas flow rate in the vertical direction at the position of the slit A1 is good when setting the slit width of the slit A3 to 5 mm rather than when setting the slit width of the slit A3 to 20 mm. It was found from this result that uneven gas flow in the vertical direction of the first region R1 may be particularly suppressed by narrowing the slit width of the slit A3. It is considered that this is because the exhaust conductance near the slit A3 is deteriorated by narrowing the slit width of the slit A3 facing the second region R2. In other words, the exhaust flow velocity tends to be high in a region below the slit A3 close to the exhaust port 28, and it is considered that the high exhaust flow velocity in the region below the slit A3 is alleviated due to the deterioration of the exhaust conductance.

(Analysis C)

Analysis C was conducted by simulation to calculate, in the substrate processing apparatus 1, similarly to Analysis A, a gas flow-rate distribution in the vertical direction at the positions of the slits A1 to A3 when the gas was discharged from the nozzle 31 to the first region R1 and the gas was discharged through the exhaust port 28. In Analysis C, the simulation was performed by changing the slit lengths of two slits A2 and A3. In addition, the slit widths of the slits A1 to A3 were set to the same slit widths as those of the slits A1 to A3 in Analysis A.

FIG. 7 is a diagram illustrating an opening position of a slit. In FIG. 7, regions of numbers "2" to "8" indicate each region in the vertical direction when the process region is divided into eight equal regions in the vertical direction. The region of number "2" is located at the top of the process region, and the region of number "8" is located at the bottom of the process region. A region of number "1" indicates a region above the process region, and a region of number "10" indicates a region below the process region. Further, the numbered regions with pear-shell pattern hatching indicate regions with openings, and the numbered regions without pear-shell pattern hatching indicate regions without openings. That is, in FIG. 7, the slits A1 and A2 are slits that are open from above to below the process region. Further, the slit A3 is a slit in which two central regions are open and the other regions are not open when the process region is divided into eight equal regions.

Figure 8:
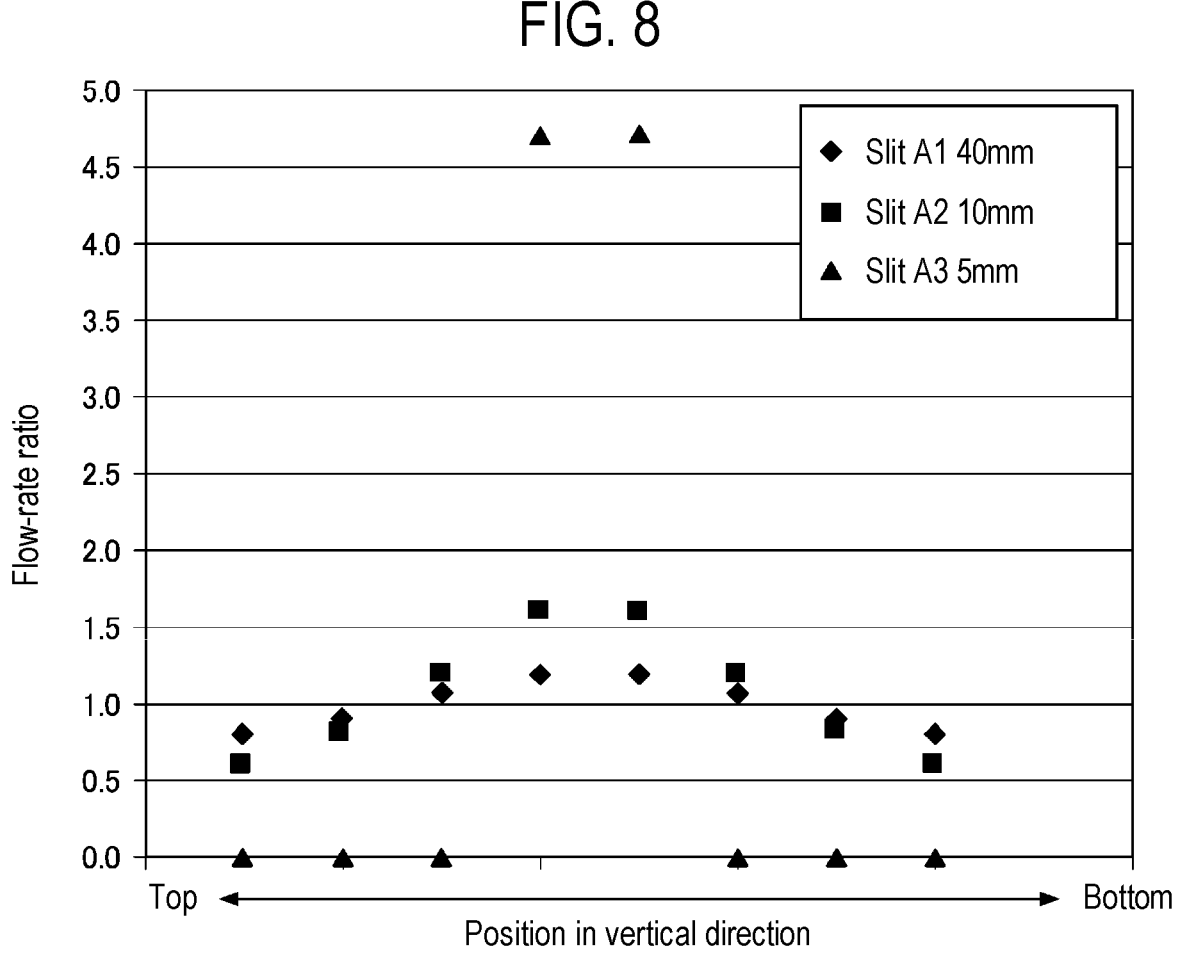
FIG. 8 is a diagram illustrating analysis results of a gas flow-rate distribution in a vertical direction.

FIG. 8 is a diagram illustrating analysis results of a gas flow-rate distribution in the vertical direction, and illustrates results when the substrate processing apparatus includes the three slits A1 to A3 illustrated in FIG. 7. In FIG. 8, the horizontal axis indicates each vertical region when the process region is vertically divided into eight equal regions and the vertical axis indicates a gas flow-rate ratio in each region. In addition, the gas flow-rate ratio was calculated by the above-described equation (1). Further, in FIG. 8, rhombic marks, square marks, and triangular marks indicate gas flow-rate ratios at the positions of the slits A1, A2 and A3, respectively.

As illustrated in FIG. 8, it can be seen that the gas flow-rate distribution has a convex shape in which the center in the vertical direction has a larger flow rate than the top and bottom at the position of the slit A1.

FIG. 9 is a diagram illustrating an opening position of a slit. In FIG. 9, regions of numbers "2" to "8" indicate each region in the vertical direction when the process region is divided into eight equal regions in the vertical direction. The region of number "2" is located at the top of the process region, and the region of number "8" is located at the bottom of the process region. A region of number "1" indicates a region above the process region, and a region of number "10" indicates a region below the process region. Further, the numbered regions with pear-shell pattern hatching indicate regions with openings, and the numbered regions without pear-shell pattern hatching indicate regions without openings. That is, in FIG. 9, the slit A1 is a slit that is open from above to below the process region. Further, the slit A2 is a slit in which two upper regions and two lower regions are open and the other regions are not open when the process region is divided into eight equal regions. Further, the slit A3 is a slit in which two central regions are open and the other regions are not open when the process region is divided into eight equal regions.

Figure 10:
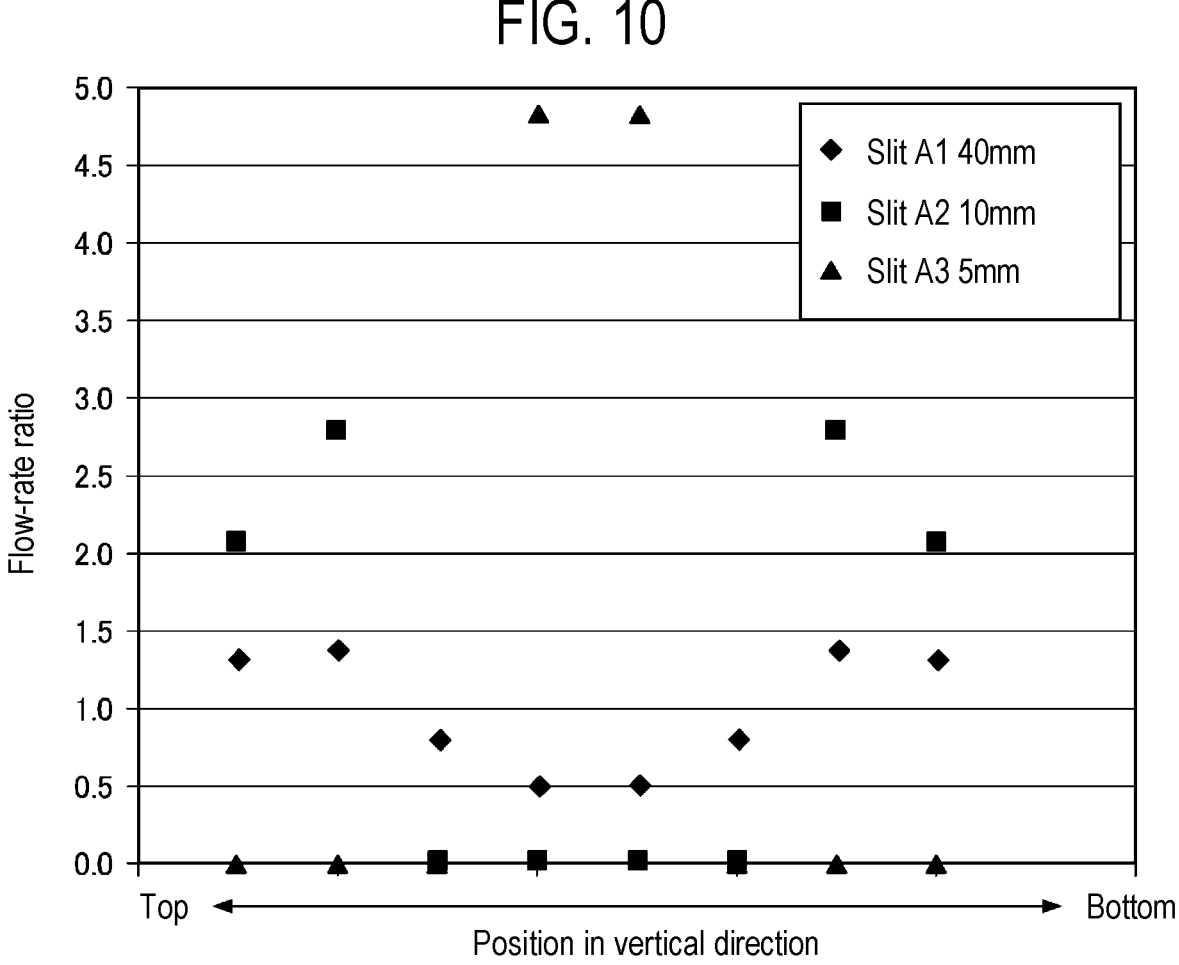
FIG. 10 is a diagram illustrating analysis results of a gas flow-rate distribution in a vertical direction.

FIG. 10 is a diagram illustrating analysis results of a gas flow-rate distribution in the vertical direction, and illustrates results when the substrate processing apparatus includes the three slits A1 to A3 illustrated in FIG. 9. In FIG. 10, the horizontal axis indicates each vertical region when the process region is vertically divided into eight equal regions, and the vertical axis indicates the gas flow-rate ratio in each region. In addition, the gas flow-rate ratio was calculated by the above-described equation (1). Further, in FIG. 10, rhombic marks, square marks, and triangular marks indicate gas flow-rate ratios at the positions of the slits A1, A2 and A3, respectively.

As illustrated in FIG. 10, it can be seen that the gas flow-rate distribution has a concave shape in which the center in the vertical direction has a smaller flow rate than the top and bottom at the position of the slit A1.

As described above, it was found from the results illustrated in FIGS. 8 and 10 that exhaust gas distribution in the vertical direction may be controlled by changing the slit lengths of the slits A2 and A3.

In addition, in the above embodiment, the inner tube 11 is an example of an inner cylinder, and the outer tube 12 and the manifold 17 are examples of an outer cylinder.

The embodiments disclosed herein should be considered to be exemplary and not limitative in all respects. The above embodiments may be omitted, replaced or modified in various embodiments without departing from the scope of the appended claims and their gist.

In the above embodiment, a case where the outer tube 12 and the manifold 17, which are formed of different materials, constitute the outer cylinder, has been described, but the present disclosure is not limited thereto. For example, the outer tube 12 and the manifold 17 may be formed of the same material and may be formed integrally with each other.

According to the present disclosure in some embodiments, it is possible to suppress uneven gas flow within a processing container.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus comprising:
    an inner cylinder having a first region formed inside the inner cylinder to accommodate a substrate;
    an outer cylinder provided outside the inner cylinder with a second region interposed between the inner cylinder and the outer cylinder and including an exhaust port formed in an end portion of a sidewall of the outer cylinder;
    a nozzle configured to discharge a gas to the first region; and
    a gas flow regulator including a plurality of slits provided from an upstream side toward a downstream side in a flow direction of the gas in a flow path of the gas from the first region to the exhaust port,
    wherein the plurality of slits at least include one slit provided in the inner cylinder and two slits provided in the second region,
    wherein the gas flow regulator includes:
        a cover member provided in the second region so as to cover the one slit provided in the inner cylinder and forming a third region between a sidewall of the inner cylinder and the cover member; and
        a partition plate provided in the third region and configured to divide the third region into two regions, and
    wherein a first slit of the two slits provided in the second region is provided in the partition plate, and a second slit of the two slits provided in the second region is provided in the cover member.

2. The substrate processing apparatus of claim 1, wherein each of the plurality of slits has a rectangular shape, an elongated hole shape, or an elliptical shape with an axial direction of the inner cylinder as a longitudinal direction.

3. The substrate processing apparatus of claim 2, wherein the plurality of slits have a same slit length.

4. The substrate processing apparatus of claim 2, wherein, among the plurality of slits, a slit located at a most upstream side in the flow direction of the gas has a widest slit width among the plurality of slits.

5. The substrate processing apparatus of claim 1, wherein at least one of the plurality of slits is divided into plural slits in an axial direction of the inner cylinder.

* * * * *